(12) United States Patent
Mourick

(10) Patent No.: US 6,381,161 B2
(45) Date of Patent: Apr. 30, 2002

(54) LOW-INDUCTANCE CIRCUIT ARRANGEMENT

(75) Inventor: Paul Mourick, Fürth (DE)

(73) Assignee: Semikron Elektronik GmbH (DE)

( * ) Notice: Subject to any disclaimer, the term of this patent is extended or adjusted under 35 U.S.C. 154(b) by 0 days.

(21) Appl. No.: 09/919,376

(22) Filed: Jul. 31, 2001

(30) Foreign Application Priority Data

Aug. 1, 2000 (DE) .......................................... 100 37 533

(51) Int. Cl.[7] ................................................. H02M 1/00
(52) U.S. Cl. ....................................................... 363/147
(58) Field of Search .................................. 327/564, 565, 327/566; 257/713; 363/147, 52, 44

(56) References Cited

U.S. PATENT DOCUMENTS 5,537,074 A * 7/1996 Iversen et al. ............... 257/712
5,550,436 A * 8/1996 Talbott ...................... 315/209 R

* cited by examiner

Primary Examiner—Shawn Riley
(74) Attorney, Agent, or Firm—Morrison Law Firm

(57) ABSTRACT

The invention relates to a circuit with low parasitic inductances, reduced current flow paths, and reduced current-circumfusion. The circuit includes a ceramic substrate supporting mutually insulated metallic connection webs and a first and a second series-connected power switch. Each power switch includes a first and a second power transistor connected in parallel and DC and AC leads. The insulation layer separates the conduction webs from a supporting substrate and is effective to minimize any parasitic inductances in the circuit arrangement.

10 Claims, 4 Drawing Sheets

LOW-INDUCTANCE CIRCUIT ARRANGEMENT

BACKGROUND OF THE INVENTION

1. Field of the Invention

The present invention relates to a circuit arrangement or circuit configuration including high-performance rectifiers and low inductance. In particular the present invention relates to a circuit arrangement having high-performance rectifiers using semiconductor switches to minimize operation time, minimize power loss, and parasitic inductance.

2. Description of the Related Art

The prior art has recognized the desirability to reduce operation time and reduce power loss. It is known that circuit arrangements including MOSFETs (metallic oxide semiconductor field-effect transistors) or IGBTs (insulated gate bipolar transistors) with antiparallel-connected free-running diodes are well suited to operate relatively quickly and with reduced power loss.

The circuit arrangements include rectifiers and must be of low-inductance design to prevent the generation of voltage spikes. The voltage spikes especially occur during power-off operation. This means that to minimize voltage spikes, circuit arrangements must have low leakage inductances in an intermediate circuit, on connecting leads, and on the substrate surface itself. In the case of low-voltage MOSFETs, even leakage inductances in the 20 nH (nanohenry) range may lead to voltage spikes which can destroy the semiconductor switches.

There are many prior art examples including individual and semiconductor modules with individual design features specifically directed to reduce parasitic inductance. Examples of these are EP 0277 546, DE 39 37 045, and EP 0 609 528.

EP 0 277 546 describes a method of reducing parasitic inductances in the direct-current leads of individual switches. In this reference, two DC leads are arranged in close proximity and are at least partly parallel to each other. This arrangement causes a small current-diffuse area in a region of closely adjacent leads, and this sector of the leads is therefore of low inductance.

DE 39 37 045 describes a method for reducing parasitic inductances in the DC leads of a half-bridge. In this reference, two DC leads are in close proximity, but with an AC lead between the positive and negative lines. The leads are at least partly parallel to each other. This causes a reduction in size of the current-circumfused area in the region of the closely adjacent lead configuration and thus a relatively low inductance of this lead sector.

EP 0 609 528 also describes a method for reducing parasitic inductances in a parallel and closely adjacent DC leads of an individual switch. In this reference, the semiconductor components are arranged symmetrically on a substrate.

The prior art also includes power semiconductor modules in pressure contact technology. Examples of this technology can be found in DE 196 30 173 and DE 593 06 387. This type of power semiconductor module consists of ceramic substrates to which contact surfaces are applied, and on which semiconductor components are arranged.

The semiconductor components are connected to contact surfaces by soldering. The semiconductor components have bond connections to other semiconductor components or other second contact surfaces which are applied to the substrate and insulated against the first contact surface.

In this type of construction, pressure contacting relates to two different types of bonds. A first type of bond is the electrical bond of the leads with the associated contact surfaces of the substrate. The second type of bond is a thermal bond between the substrates or between the entire module and a cooling body. In these types of bonds, plastic elements can be used, which transfer pressure applied to the module from the outside, to the connecting elements and/or to the substrate to establish a secure electrical or thermal contact.

All low-inductance circuit arrangements described in prior art have in common that they achieve a certain reduction of parasitic inductances only in the partial areas of the overall system of intermediate circuit-rectifier. The best values that can thus be achieved for the overall inductance of this system are presently above 20 nH (nanohenry).

In EP 0 277 546, the transistors forming the individual switch are in close proximity to each other, and yet the current can flow through the circuit arrangement along different paths, and in particular, along paths of different lengths. This current flow causes different current-circumfused areas and also different inductances for the different conduction paths. Current-circumfused means that the current flows around a certain area. In drawings referring to a current-circumfused area, the current-circumfused area may be represented as a shaded section.

Unfortunately, the design of a half-bridge with this type of individual switches can never be low-inductance because of the necessary external circuitry. Taking all characteristics together, these designs may lead to a certain reduction in the parasitic inductances of the overall system intermediate circuit/DC/AC converter. However, this reduction still does not meet all the consumer and design requirements of minimizing parasitic inductances.

Particularly, DE 39 37 045 fails to meet the goal of minimizing parasitic inductance for two major reasons. The first reason is that the DC leads are not arranged at a minimal distance from each other, since the AC lead is arranged between the two DC leads. Thus the current-circumfused area in the region of the DC leads is not minimal, and the inductances for this region are correspondingly not minimal. The second reason is that the power transistors of the first and second power switches are arranged relatively far distant from each other, which also increases the parasitic inductances.

Referring now to FIG. 1, showing a typical design of a half-bridge intermediate circuit. The intermediate circuit includes a capacitor 1 with at least one positive lead 2, at least one negative lead 3, and at least one power switch 4.

Power switches 4 may be designed as MOSFETs or IGBTs. If power switches 4 are designed as IGBTs, an additional free-running diode 5 is required on each power switch 4. An AC lead 6 is supplied between power switches 4. A current flow 7 occurs from positive lead 2 to negative lead 3 during a commutation process. Current flow 7 flows around a current-circumfused area 8. The size of current-circumfused area 8 is a direct measure for the parasitic inductances which occur and illustrates the cross section of a coil with one winding.

Additionally referring now to FIG. 2 showing a realistic case of circuit arrangement similar to FIG. 1 where first and second power switches 4 include several parallel-connected power transistors. As a result of the additional power transistors, current flow 7 and current-circumfused area 8 are different. This design emphasizes that since the shape of current-circumfused area 8 changes relative to the additional transistors, the associated inductances for each power transistor are different.

Additionally referring now FIG. 3, a ceramic substrate 9 supports a positive lead 17 having as a positive surface a copper laminated surface 12. Ceramic substrate 9 also supports a negative lead 16 with a copper laminated surface 10 and an AC lead 18 with a copper laminated surface 11. For simplicity, auxiliary connections such as a gate, a base, or auxiliary emitters, are not shown.

On the plus area are multiple first power transistors 13 which constitute a first power switch, and a free-running diode 14. Bond wires 15 connect emitters of the power transistors to surface 11 of AC lead 18.

Arranged on surface 11 of AC lead 18 are second power transistors 19 as well as a second free-running diode. Bond wires 15 connect second power transistors 19 to the copper laminated surface 10 of negative lead 16.

Positive lead 17, negative lead 16 and AC lead 18 are also arranged on each respective surface matching their polarity. Typical for such arrangements, according to prior art, is an arrangement where positive and negative leads are already in close proximity, at least up to a short distance above the substrate. Here, current flow 7 indicates the maximum current-circumfused area. This area correspondingly determines the parasitic inductance of the circuit arrangement. With such circuit arrangements typical inductances in the range of 20 to 50 nH can be achieved in relation to the plane of the substrate.

Additionally referring now to FIG. 5, each of the respective copper laminated surfaces for each respective lead is positioned on substrate 9. Here, first power transistor 13 is on the positive surface 12 of positive lead 17 (not shown in this figure). Second power transistor 19 is on AC surface 11 of AC lead 18 (not shown in this figure).

Bond wires 15 connect the emitter of first power transistor 13 to copper laminates surface 11 of AC lead 18. Bond wires 15 also connect the emitter of second power transistor 19 to copper laminates surface 10 of negative lead 16 (not shown in this figure). An area 24, is current-circumfused in the plane (as shown), and is understood to extend below positive lead 17 (and surface 12) to the surface of substrate 9, or from the region of the bond connections up to a plain with surface 12 and beyond. A positive lead 20 joins positive lead surface 12 and a negative lead 21 joins negative lead surface 10

OBJECTS AND SUMMARY OF THE INVENTION

An object of the present invention is to optimize the parasitic inductances of a circuit arrangement in the region of the leads.

Another object of the present invention is to optimize parasitic inductances in a circuit in the region of the semiconductor components, arranged on an electrically insulating substrate.

Another object of the present invention is to optimize parasitic inductance in a circuit, so that the total inductance of the arrangement is at a magnitude of 2 nH or smaller, i.e. at least one order of magnitude below that of the prior art.

The present invention relates to a circuit with low parasitic inductances, reduced current flow paths, and reduced current-circumfusion. The circuit includes a ceramic substrate supporting mutually insulated metallic connection webs and a first and a second series-connected power switch. Each power switch includes a first and a second power transistor connected in parallel and DC and AC leads. The insulation layer separates the conduction webs from a supporting substrate and is effective to minimize any parasitic inductances in the circuit arrangement.

According to an embodiment of the present invention there is provided, a circuit, comprising: an substrate, a plurality of webs on the substrate, each web being a mutually insulated metallic connection web, an insulation layer between each web and the substrate, each web joining at least a first and a second power switch, the first and the second power switch connected in series, each first and second power switch including at least a first and a second power transistor, at least a first and a second DC lead, and at least a first AC lead, the first and second power transistors electrically connected in parallel, the first power transistor proximate each respective second power transistor in a row on the substrate, the at least first and second DC leads and the at least first AC joining the at least one first and second power transistor effective to enable an electrical connection through the circuit, the at least first and second DC leads positioned proximate each other in at least a first strip section and having at least a first portion parallel a support surface of the substrate, at least one of the first and the second DC leads in a second strip section parallel the support surface of the substrate and joining at least one of the plurality of webs effective to minimize a current flow path in the circuit, and the at least one of the plurality of webs has at least one contact point with the substrate effective to minimize a current-circumfused area in the circuit and reduce corresponding parasitic circuit inductance.

According to another embodiment of the present invention there is provided, a circuit, wherein: the plurality of webs arrayed between each respective first and second power transistors, and at least one of the first and the second DC leads is effective as a pressure-transmitting element to an external pressure-contact model.

According to another embodiment of the present invention there is provided, a circuit, wherein: the first and the second power switches are symmetrical to a center axis of the substrate and adjacent along a respective first and a second row of the first and the second power transistors.

According to another embodiment of the present invention there is provided, a circuit, wherein: the first and the second power transistors are one of a MOSFET-type and a IBGT-type transistor.

According to another embodiment of the present invention there is provided, a circuit, further comprising: at least a first free-running diode on each the first and the second row of respective the first and second power transistors.

According to another embodiment of the present invention there is provided, a circuit, wherein: the first and the second power transistors are the other of the MOSFET-type and the IBGT-type transistor.

According to another embodiment of the present invention there is provided, a circuit, wherein: the plurality of webs is effective to reduce a total inductance in the circuit to at or below 2 nH.

According to another embodiment of the present invention there is provided, a circuit, comprising: an substrate, a means for reducing parasitic inductance in the circuit, the means for reducing on the substrate, an insulation layer between the substrate and the means for reducing, the means for reducing joining at least a first and a second power switch, the first and the second power switch connected in series, each of the first and the second power switch including at least a first and a second power transistor, at least a first and a second DC lead, and at least a first AC lead, the first and second power transistors electrically connected in parallel, each the first power transistor proximate each respective the second power transistor in a row on the substrate, the at least first and second DC leads and the at least first AC joining the at least one first and the second power transistor effective to enable an electrical connection through the circuit, the at least first DC lead proximate the and second DC leads in at least a first strip section and having at least a first portion, the first strip portion parallel a support surface of the substrate, at least one of the first and the second DC lead in a second strip section parallel the support surface of the substrate and joining to the means for reducing effective to minimize a current flow path in the circuit, and the means for reducing has at least one contact point with the substrate effective to minimize a current-circumfused area in the circuit and reduce corresponding parasitic circuit inductance.

According to another embodiment of the present invention there is provided, a circuit, wherein: the means for reducing parasitic inductance is effective to reduce a total inductance in the circuit to at or below 2 nH.

According to another embodiment of the present invention there is provided, a circuit, wherein: the means for reducing includes a plurality of webs, each the web being a mutually insulated metallic connection web, and each the web between each the first and second power transistor.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Additionally referring now to FIG. 4 where leads (described later) are integrated components of the circuit arrangement to achieve minimal inductances in the substrate region. Auxiliary connections are not shown for the sake of simplicity.

Figure 1:
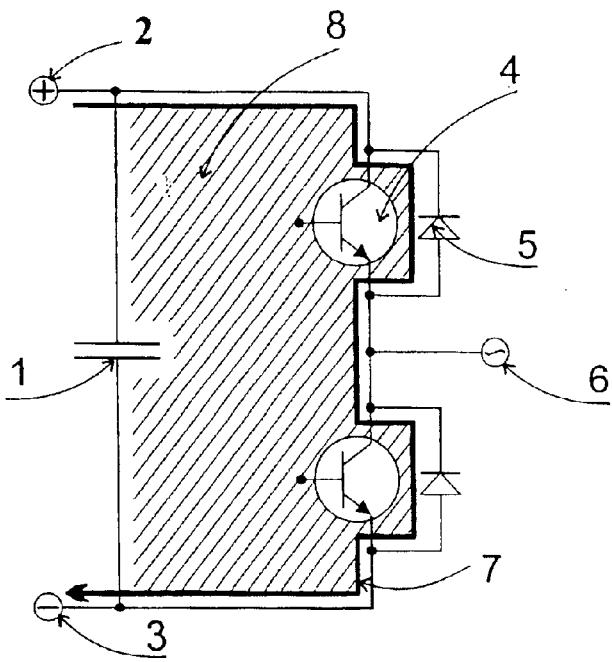
FIG. 1 is a schematic view of a conventional half-bridge and the current-circumfused area.
Figure 2:
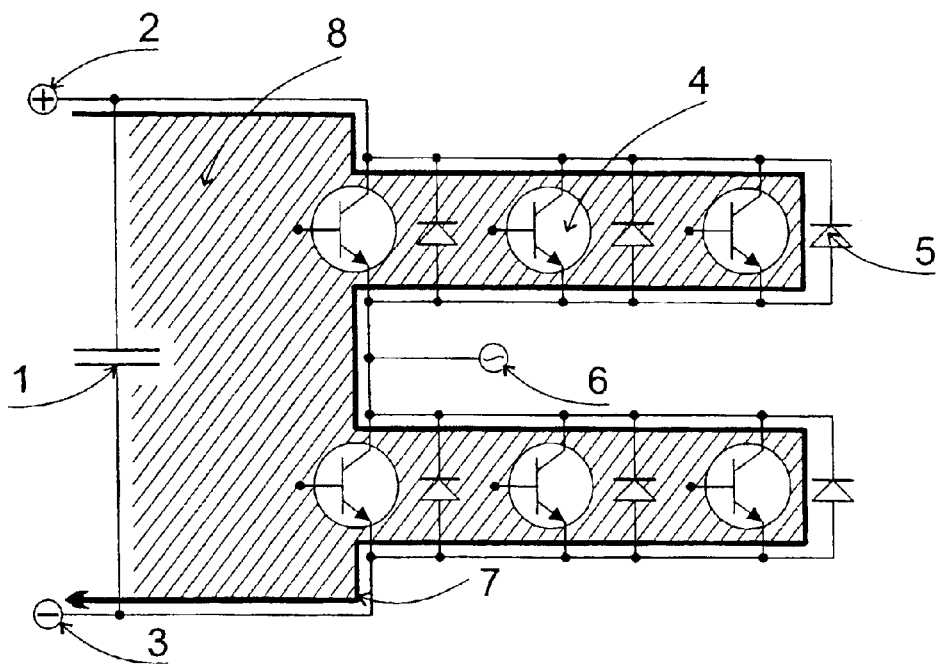
FIG. 2 is a half-bridge similar to FIG. 1 including additional power transistors and the maximum current-circumfused area of the present invention.
Figure 3:
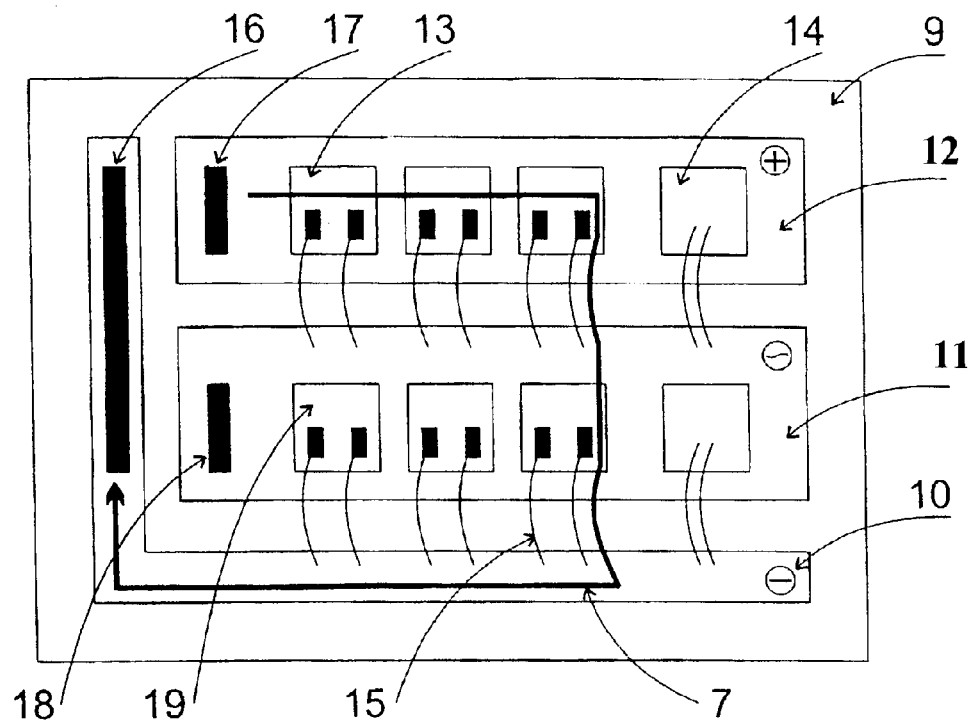
FIG. 3 is a conventional substrate and power switch design for a half-bridge and the maximum current-circumfused area for this arrangement.

It should be understood, that the inventive concept consists primarily of the combination of two main characteristics with additional inventive supporting arrangements. The first characteristic that first power transistors 13, such as MOSFETs, are arranged in very close possible proximity to second power transistors 19 (unlike FIG. 3), and that first and second power transistors 13, 19 are connected in series not parallel. The second characteristic is that at least a pair of DC leads, including a positive lead 20 and a negative lead 21, are positioned in a strip or band fashion on the circuit, as will be explained.

Each lead 20, 21 includes at least the following sections, shown later. A first section A, which extends from the intermediate circuit lead close to the surface of substrate 9. A second section B which runs parallel to the surface of substrate 9. A third section C, follows the parallel section and represents the typically vertical contacting of the appropriate copper laminated surface of the substrate. At least one of the two DC leads is designed in this fashion.

Second section B is important for the inventive concept and is not exclusively arranged as a strip generally parallel to the substrate surface, but also has at least one web 23 in each area between the series-connected first and second power transistors 13, 19 that runs parallel to these. Webs 23 extend down to the surface of substrate 9 are separated from the copper laminated surfaces of the other lead types only by a thin insulating layer (not shown), as will be explained.

In first section A, positive lead 20 is generally parallel to negative lead 21 and in this area each is separated from the other only by an insulating layer (not shown). Only webs 23 of second section B are shown and a strip-like part extending above webs 23 and connecting webs 23 is not shown.

Figure 4:
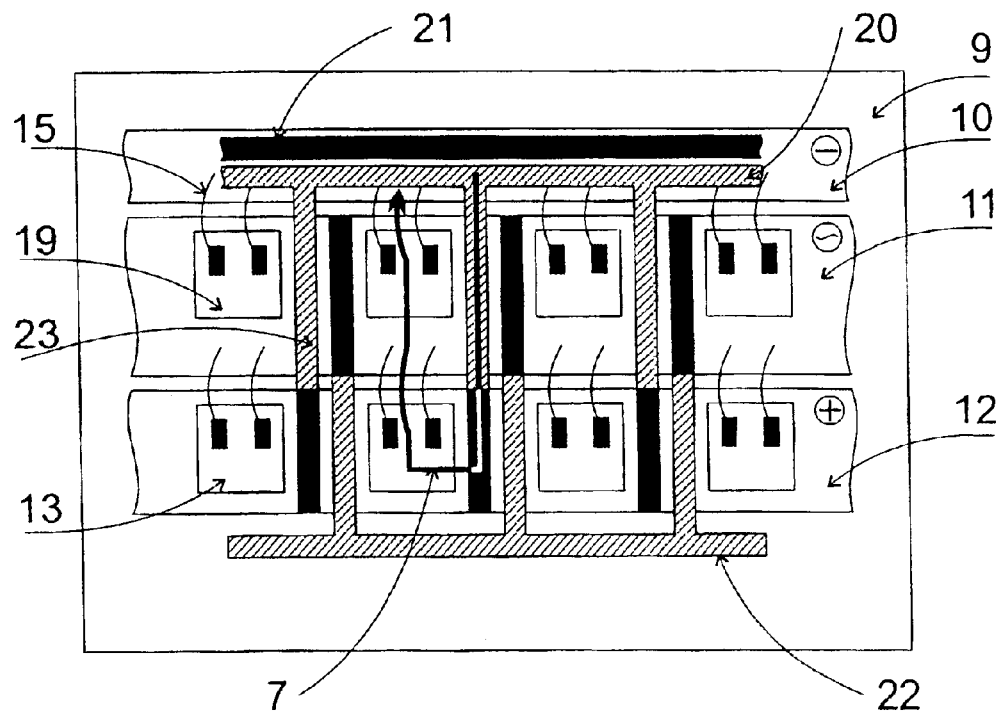
FIG. 4 is a partial view of a circuit arrangement according to the present invention.

In the shaded area of FIG. 4, it is to be understood that parallel webs 23 are separated from the surface of substrate 9 and the localized copper laminated negative lead surface 10 and AC lead surface 11 by a thin insulating layer (not shown). In the unshaded area, webs 23 are shown flush or positively connected with the respective copper lamination surface. The equivalent applies to an AC lead 22, described later. The path of current flow 7 indicates the maximum current-circumfused area.

As a result of this arrangement, the current-circumfused area in relation to the plane of the substrate is minimized. Furthermore, the symmetry of the arrangement results in an even (balanced) current load and in even (balanced) parasitic inductances for all power transistors.

With such circuit arrangements, inductances at a magnitude of 1 nH and smaller can be achieved in relation to the plane of the substrate.

AC lead 22 is designed in the same fashion as positive lead 20, i.e. strip-like with corresponding webs 23 reaching down to the DCB ceramics.

Figure 6:
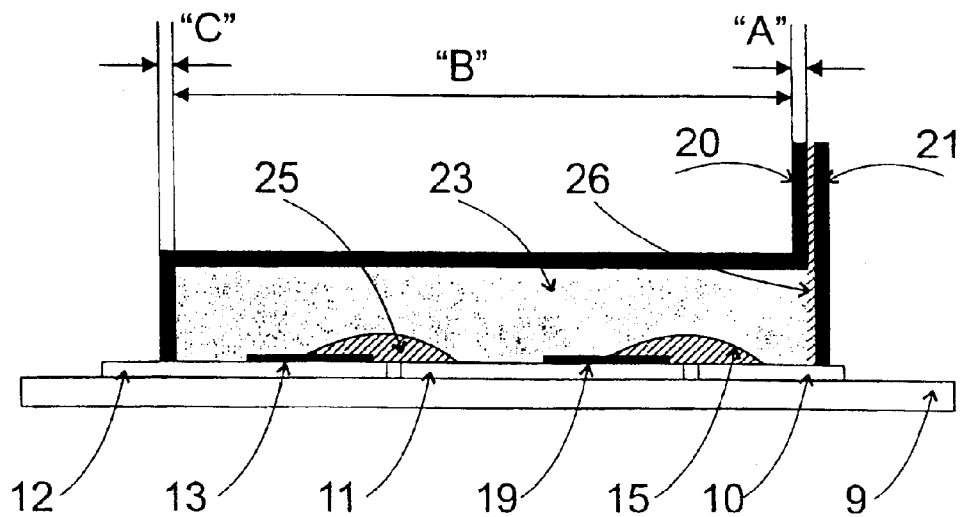
FIG. 6 is a side view of the current-circumfused area of the leads arranged according to the present invention.

Additionally referring now to FIG. 6, first section A, second section B, and third section C are shown. Webs 23 according to the invention, reach down to the surface of substrate 9, below the strip-like parts of positive lead 20, and as a result, this area is no longer current-circumfused. In sum, the current flow to copper laminated surface 12 now occurs only directly above substrate 9, while the further current flow to the negative lead 21 occurs in substrate 9, or in the sections with bond connections through these. This results in three significant current-circumfused areas.

Figure 5:
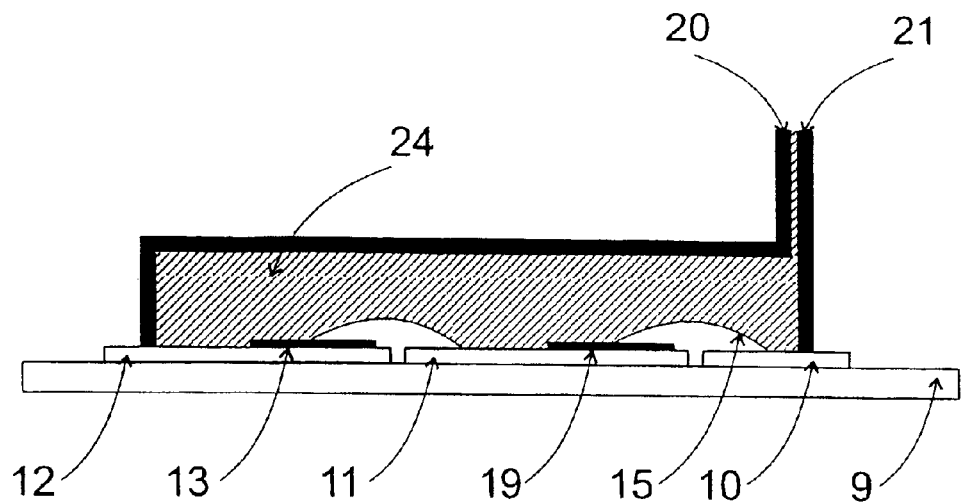
FIG. 5 is a side view of the current-circumfused area of the leads according to prior art.

A section 26 between negative lead 21 and positive lead 20, and a section 25 between the current-circumfused area to the top of bond wires 15 and to the bottom by webs 23. It should be understood, as can be see by comparison with FIG. 5, that the current-circumfused area is greatly minimized thus a corresponding reduction of the parasitic inductances of the circuit arrangement according to the invention. To achieve a completely low-inductance circuit arrangement, the intermediate-circuit capacitors (not shown) must be arranged directly on DC input leads.

Figure 7:
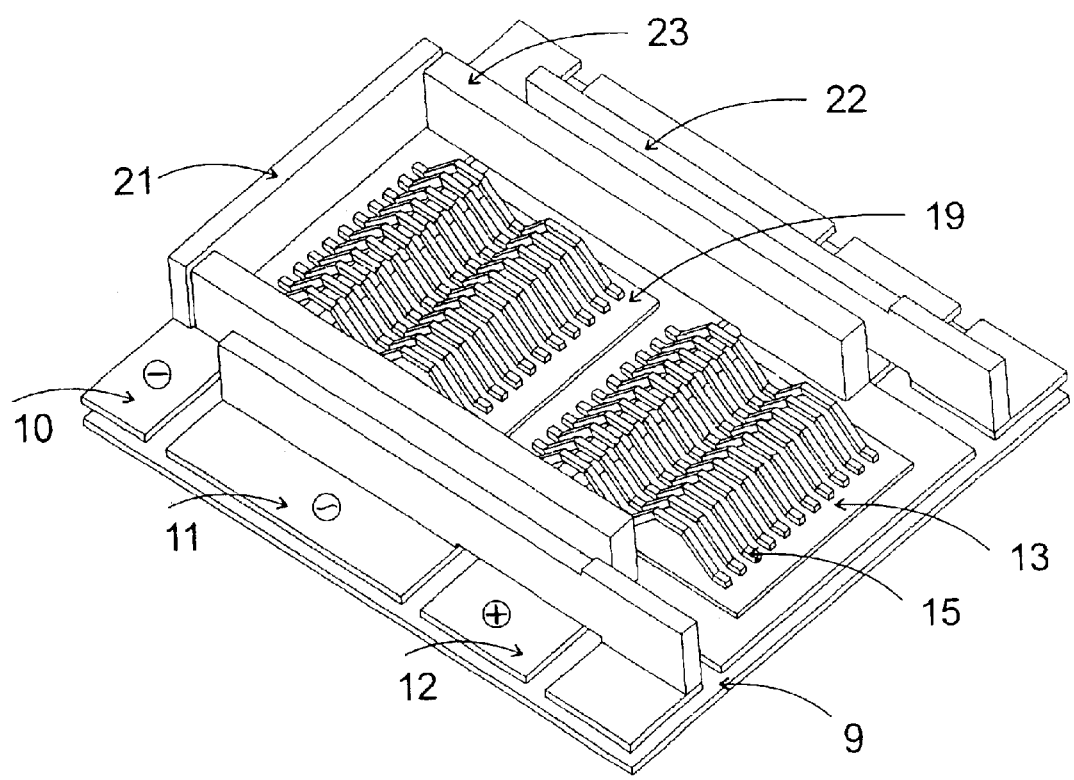
FIG. 7 is a partial perspective view of a circuit arrangement according to the present invention.

Additionally referring now to FIG. 7, including first power transformer 13 and second power transformer 19. Not shown in this drawing are again all auxiliary connections and the closed strip-like part of the leads above the substrate across the webs, which is interrupted only when necessary for passing leads for auxiliary connections.

Webs 23 positive lead surface 12, negative lead surface 10, and AC lead surface 11 may, in addition to their actual function of keeping the inductances in the leads down to a minimum, also serve as an element for relaying pressure to the pressure-contacted structures (not shown).

Each of the leads has direct contact through webs 23 to its designated copper laminated area, and in pressure contact structures web 23 can serve for electrical pressure-contacting the lead itself as well as for thermal pressure-contacting substrate 9 on a cooling body (not shown). It should be understood, that this type of function, providing thermal pressure contact, can also be provided by any web 23 of a lead on the copper-laminated surfaces not dedicated to the web, since the web is separated from the same only by an insulating layer (not shown), typically a plastic film.

It should be understood, that the present design is suited for adaption to pressure-contact structures. The sum of the parasitic inductances in the circuit and semiconductor module in the area of the leads and substrate 9 reaches a magnitude of 1 nH or less. This is a dramatic reduction from the previously known art.

It should be understood, that providing a circuit with optimized parasitic inductances, is achieved by minimizing the entire circuit arrangement current-circumfused area from the positive to the negative lead of the intermediate circuit.

The successful reduction in parasitic inductances involves completing at least some of the following steps, each different from the presently known art.

First, a first and a second power switch are arranged in very close proximity to each other on substrate 9.

Second, the first and second power switches are in one row and can therefore connected to each other at the shortest possible distance.

Third, power transistors 13, 19, which form the first and second power switches, and any free-running diodes are also in a row at very close proximity.

Fourth, the leads of the positive and negative connections are designed and positioned in strips or bands.

Fifth, the leads of the positive and negative connections are arranged in parallel until they closely approach the substrate.

Sixth, the leads of the positive and negative connections are in close proximity to each other and separated only by an insulation layer.

Seventh, a section of the connecting strip of at least one of two DC leads (20, 21) is arranged close to substrate 9, parallel to substrate 9, with the shortest possible distance above power transistors 13, 19.

Eight, the section of at least one DC lead, that runs parallel to substrate 9 is provided with webs 23. In the region between power transistors 13, 19, of the power switches, webs 23 extend down as far as the base plate, and are separated from the base plate only by the layer necessary for insulation.

Ninth, webs 23 can serve as pressure contacts of substrate 9 upon a cooling or other body. Thus, webs 23 may additionally replace the pressure elements known in the prior art. and minimized parts and assembly risks.

In sum, thanks to the above-described measures, inductance in the circuit is minimized in the substrate plane as well as in all vertical planes defined by the leads.

Although only a single or few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the scope of this invention as defined in the following claims. In the claims, means-plus-function clauses are intended to cover the structures described or suggested herein as performing the recited function and not only structural equivalents but also equivalent structures. Thus, for example, although a nail and screw may not be structural equivalents in that a nail relies entirely on friction between a wooden part and a cylindrical surface whereas a screw's helical surface positively engages the wooden part, in the environment of fastening wooden parts, a nail and a screw may be understood as equivalent structures.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit, comprising:
   an substrate;
   a plurality of webs on said substrate;
   each said web being a mutually insulated metallic connection web;
   an insulation layer between each said web and said substrate;
   each said web joining at least a first and a second power switch;
   said first and said second power switch connected in series;
   each said first and said second power switch including at least a first and a second power transistor, at least a first and a second DC lead, and at least a first AC lead;
   said first and second power transistors electrically connected in parallel;
   each said first power transistor proximate each respective said second power transistor in a row on said substrate;
   said at least first and second DC leads and said at least first AC joining said at least one first and said second power transistor effective to enable an electrical connection through said circuit;
   said at least first and second DC leads positioned proximate each other in at least a first strip section and having at least a first portion parallel a support surface of said substrate;
   at least one of said first and said second DC lead in a second strip section parallel said support surface of said substrate and joining at least one of said plurality of webs effective to minimize a current flow path in said circuit; and
   said at least one of said plurality of webs has at least one contact point with said substrate effective to minimize a current-circumfused area in said circuit and reduce corresponding parasitic circuit inductance.

2. A circuit, according to claim 1, wherein:
   said plurality of webs arrayed between each respective said first and said second power transistors; and at least one of said first and said second DC leads is effective as a pressure-transmitting element to an external pressure-contact model.

3. A circuit, according to claim 2, wherein:
said first and said second power switches are symmetrical to a center axis of said substrate and adjacent along a respective first and a second row of said first and said second power transistors.

4. A circuit, according to claim 3, wherein:
said first and said second power transistors are one of a MOSFET-type and a IBGT-type transistor.

5. A circuit, according to claim 4, further comprising:
at least a first free-running diode on each said first and said second row of respective said first and second power transistors.

6. A circuit, according to claim 5, wherein:
said first and said second power transistors are said other of said MOSFET-type and said IBGT-type transistor.

7. A circuit, according to claim 4, wherein:
said plurality of webs is effective to reduce a total inductance in said circuit to at or below 2 nH.

8. A circuit, comprising:
an substrate;
a means for reducing parasitic inductance in said circuit;
said means for reducing on said substrate;
an insulation layer between said substrate and said means for reducing;
said means for reducing joining at least a first and a second power switch;
said first and said second power switch connected in series;
each said first and said second power switch including at least a first and a second power transistor, at least a first and a second DC lead, and at least a first AC lead;
said first and second power transistors electrically connected in parallel;
each said first power transistor proximate each respective said second power transistor in a row on said substrate;
said at least first and second DC leads and said at least first AC joining said at least one first and said second power transistor effective to enable an electrical connection through said circuit;
said at least first DC lead proximate said and second DC leads in at least a first strip section and having at least a first portion;
said first strip portion parallel a support surface of said substrate;
at least one of said first and said second DC lead in a second strip section parallel said support surface of said substrate and joining to said means for reducing effective to minimize a current flow path in said circuit; and
said means for reducing has at least one contact point with said substrate effective to minimize a current-circumfused area in said circuit and reduce corresponding parasitic circuit inductance.

9. A circuit, according to claim 8, wherein:
said means for reducing parasitic inductance is effective to reduce a total inductance in said circuit to at or below 2 nH.

10. A circuit, according to claim 9, wherein:
said means for reducing includes a plurality of webs;
each said web being a mutually insulated metallic connection web; and
each said web between each said first and second power transistor.

* * * * *